(12) United States Patent
Park et al.

(10) Patent No.: US 8,883,561 B2
(45) Date of Patent: Nov. 11, 2014

(54) SEMICONDUCTOR DEVICE AND METHOD OF EMBEDDING TSV SEMICONDUCTOR DIE WITHIN ENCAPSULANT WITH TMV FOR VERTICAL INTERCONNECT IN POP

(75) Inventors: DongSam Park, Kyoungki-do (KR); YongDuk Lee, Seoul (KR)

(73) Assignee: STATS ChipPAC, Ltd., Singapore (SG)

( * ) Notice: Subject to any disclaimer, the term of this patent is extended or adjusted under 35 U.S.C. 154(b) by 86 days.

(21) Appl. No.: 13/098,440

(22) Filed: Apr. 30, 2011

(65) Prior Publication Data

US 2012/0273960 A1  Nov. 1, 2012

(51) Int. Cl.
| | |
|---|---|
| *H01L 21/00* | (2006.01) |
| *H01L 23/00* | (2006.01) |
| *H01L 23/498* | (2006.01) |
| *H01L 21/48* | (2006.01) |
| *H01L 21/56* | (2006.01) |
| *H01L 25/16* | (2006.01) |
| *H01L 23/538* | (2006.01) |
| *H01L 23/48* | (2006.01) |
| *H05K 1/18* | (2006.01) |
| *H01L 23/29* | (2006.01) |

(52) U.S. Cl.
CPC ....... *H01L 23/49827* (2013.01); *H01L 2224/94* (2013.01); *H01L 2224/05639* (2013.01); *H01L 2224/13144* (2013.01); *H01L 2924/01322* (2013.01); *H01L 24/06* (2013.01); *H01L 2224/13155* (2013.01); *H01L 2924/13091* (2013.01); *H01L 24/20* (2013.01); *H01L 24/19* (2013.01); *H01L 2224/13139* (2013.01); *H01L 2224/73265* (2013.01); *H01L 2224/12105* (2013.01); *H01L 23/481* (2013.01); *H01L 2224/1132* (2013.01); *H01L 2224/73204* (2013.01); *H01L 2224/13147* (2013.01); *H01L 2224/11849* (2013.01); *H01L 2224/32225* (2013.01); *H01L 2924/12041* (2013.01); *H01L 23/49822* (2013.01); *H01L 2224/13124* (2013.01); *H01L 24/48* (2013.01);

(Continued)

(58) Field of Classification Search
CPC ... H01L 21/568; H01L 21/565; H01L 23/565; H01L 23/481; H01L 24/20; H01L 24/19; H01L 25/16
USPC .................. 438/126, 107; 257/724, E23.021, 257/E23.107, E21.513
See application file for complete search history.

(56) References Cited

U.S. PATENT DOCUMENTS 5,250,843 A * 10/1993 Eichelberger ................. 257/692
5,994,781 A * 11/1999 Smith ............................ 257/773

(Continued)

*Primary Examiner* — Caridad Everhart
(74) *Attorney, Agent, or Firm* — Robert D. Atkins; Patent Law Group: Atkins and Associates, P.C.

(57) ABSTRACT

A semiconductor device has a carrier or first conductive layer with a plurality of TSV semiconductor die mounted over the carrier or first conductive layer. An encapsulant is deposited around the first semiconductor die and over the carrier or first conductive layer to embed the first semiconductor die. A conductive TMV is formed through the encapsulant. A second conductive layer is formed over a first surface of the encapsulant. A first insulating layer is formed over the first surface of the encapsulant while exposing portions of the second conductive layer. A second insulating layer is formed over the second surface of the encapsulant while exposing portions of the first conductive layer. Alternatively, a first interconnect structure is formed over the first surface of the encapsulant. The carrier is removed and a second interconnect structure is formed over a second surface of the encapsulant.

33 Claims, 17 Drawing Sheets

(52) U.S. Cl.
CPC ............ *H01L 2224/05611* (2013.01); *H01L 23/49816* (2013.01); *H01L 24/05* (2013.01); *H01L 2224/16145* (2013.01); *H01L 2224/06181* (2013.01); *H01L 21/4846* (2013.01); *H01L 2224/04105* (2013.01); *H01L 2224/131* (2013.01); *H01L 2224/05647* (2013.01); *H01L 24/16* (2013.01); *H01L 2224/13113* (2013.01); *H01L 24/13* (2013.01); *H01L 2224/13116* (2013.01); *H01L 21/561* (2013.01); *H01L 25/16* (2013.01); *H05K 1/185* (2013.01); *H01L 2224/05655* (2013.01); *H01L 2224/0603* (2013.01); *H01L 2224/05624* (2013.01); *H01L 2224/1146* (2013.01); *H01L 2221/6835* (2013.01); *H01L 2224/48091* (2013.01); *H01L 2224/13025* (2013.01); *H01L 2224/48227* (2013.01); *H01L 2224/32145* (2013.01); *H01L 2224/05644* (2013.01); *H01L 2224/11334* (2013.01); *H01L 2224/13111* (2013.01); *H01L 2924/15311* (2013.01); *H01L 23/5389* (2013.01); *H01L 2224/73259* (2013.01); *H01L 23/295* (2013.01)

USPC .......................... 438/107; 438/127; 257/724

(56) References Cited

U.S. PATENT DOCUMENTS

| | | | |
|---|---|---|---|
| 7,759,777 B2* | 7/2010 | Otremba et al. | 257/668 |
| 2007/0069376 A1 | 3/2007 | Dangelmaier et al. | |
| 2008/0272465 A1 | 11/2008 | Do et al. | |
| 2008/0272476 A1 | 11/2008 | Do et al. | |
| 2008/0315375 A1* | 12/2008 | Eichelberger et al. | 257/659 |
| 2009/0008792 A1* | 1/2009 | Ko et al. | 257/774 |
| 2010/0032827 A1* | 2/2010 | Hsu | 257/692 |
| 2010/0133704 A1 | 6/2010 | Marimuthu et al. | |
| 2010/0148316 A1 | 6/2010 | Kim et al. | |
| 2010/0193928 A1* | 8/2010 | Zudock et al. | 257/686 |
| 2010/0237483 A1 | 9/2010 | Chi et al. | |
| 2011/0193225 A1* | 8/2011 | Chen et al. | 257/737 |
| 2011/0204505 A1 | 8/2011 | Pagaila et al. | |
| 2011/0241218 A1* | 10/2011 | Meyer et al. | 257/774 |
| 2012/0043672 A1 | 2/2012 | Cho et al. | |
| 2012/0056312 A1 | 3/2012 | Pagaila et al. | |
| 2012/0070939 A1* | 3/2012 | Dunne et al. | 438/110 |

* cited by examiner

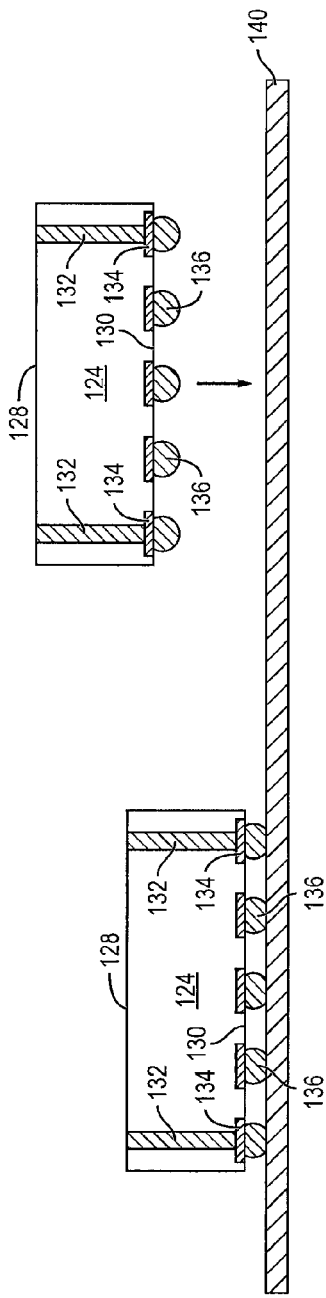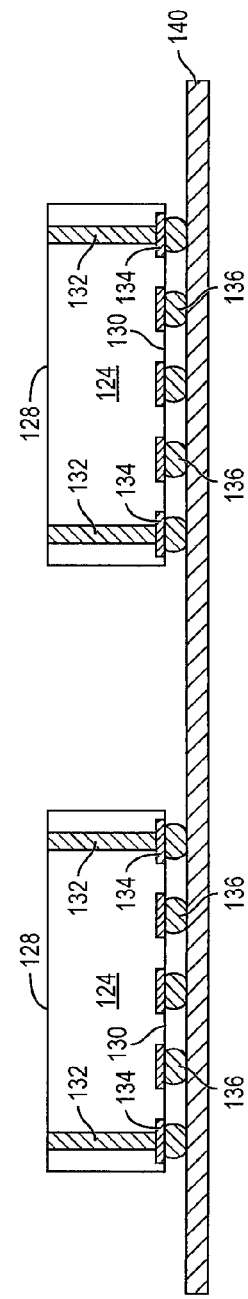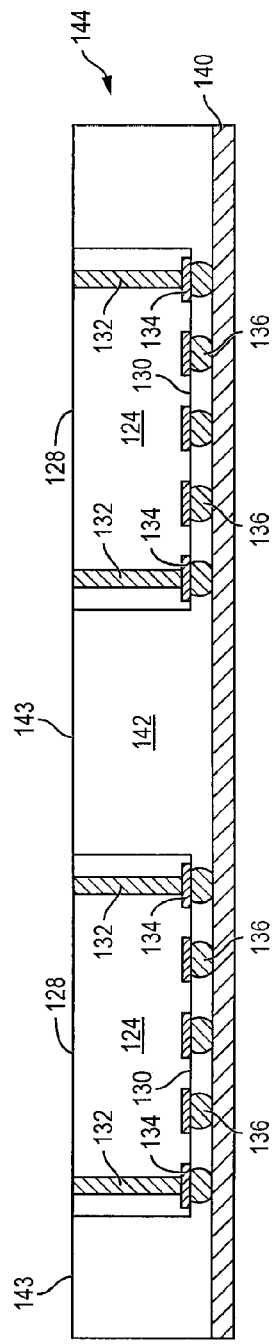

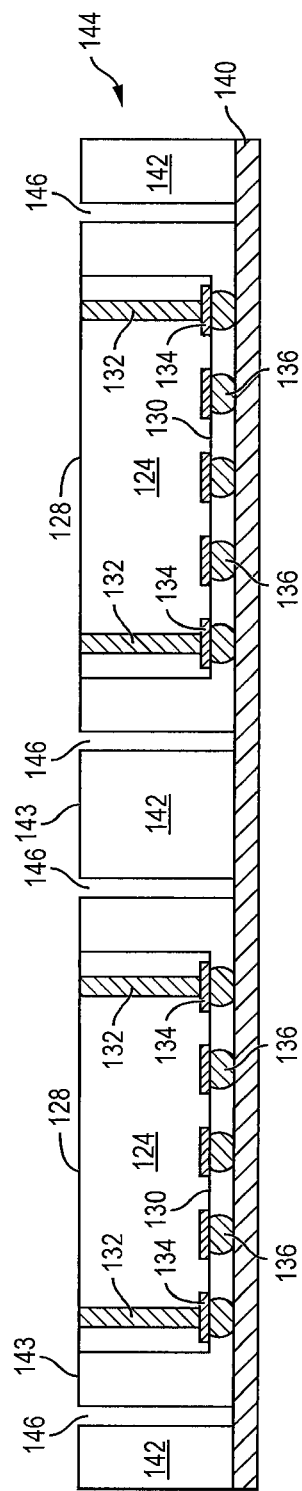
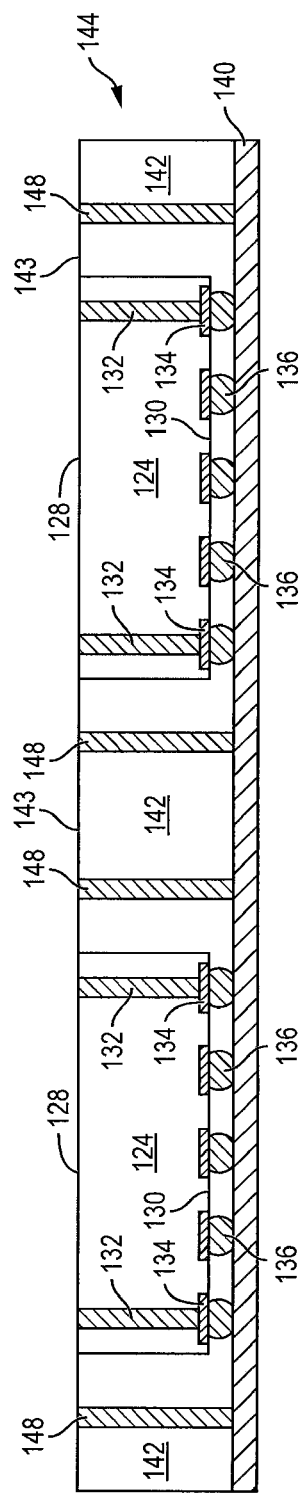
FIG. 4d
FIG. 4e

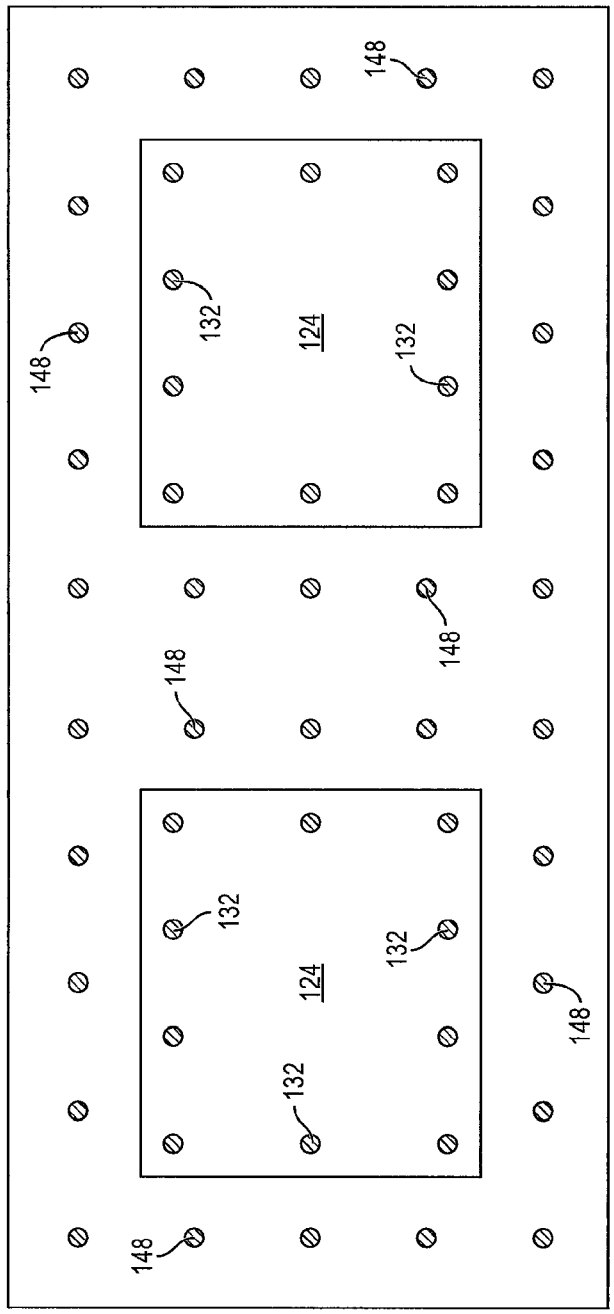
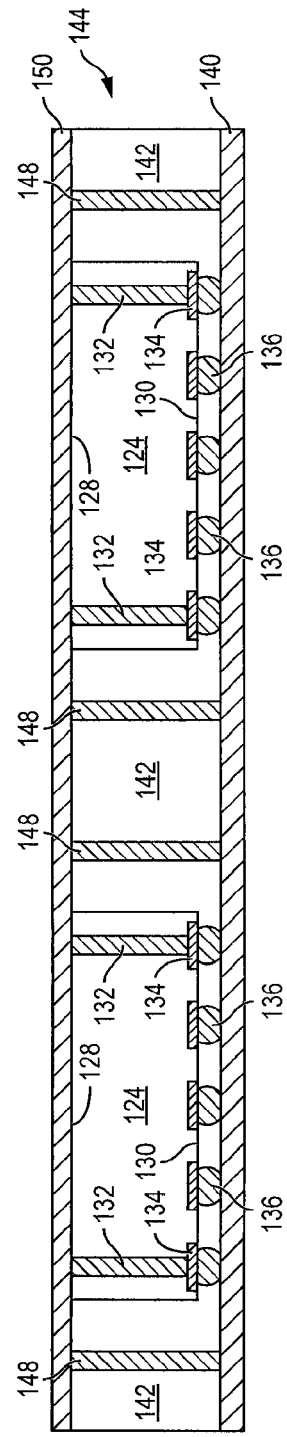
FIG. 4f
FIG. 4g

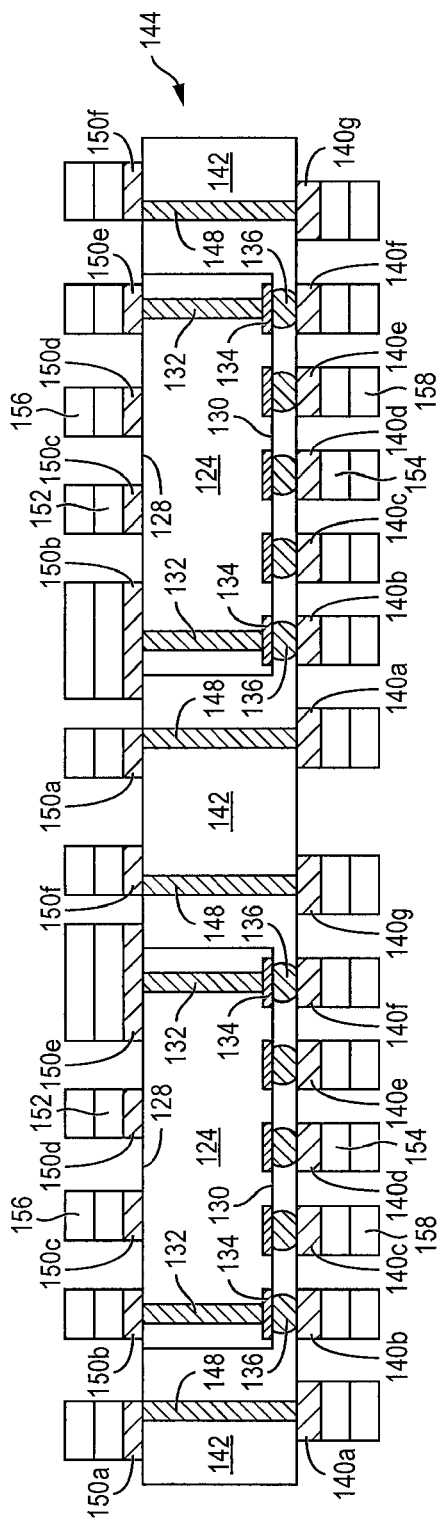
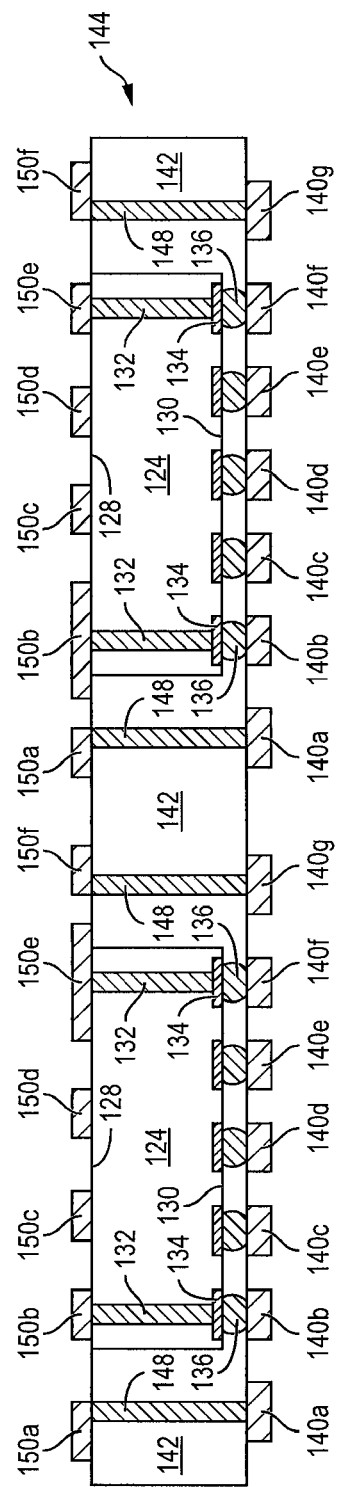
FIG. 4j
FIG. 4k

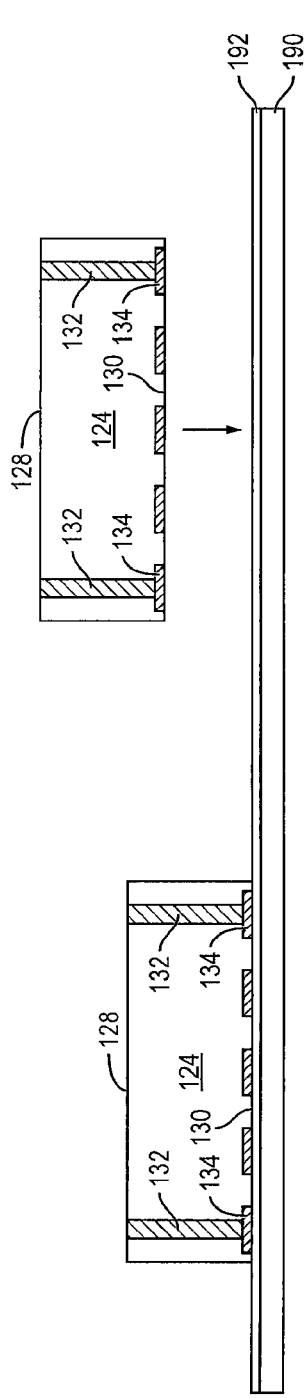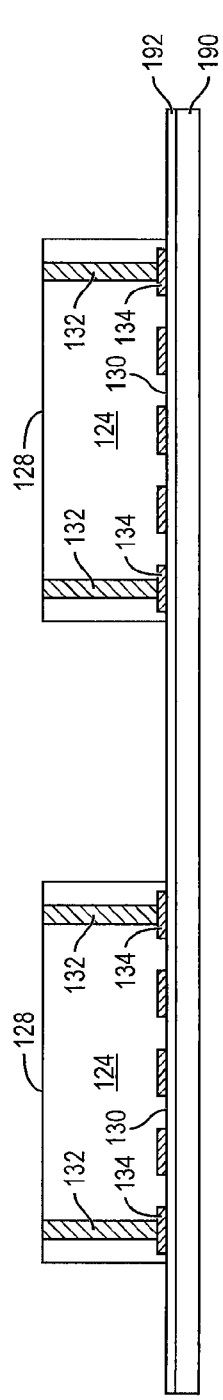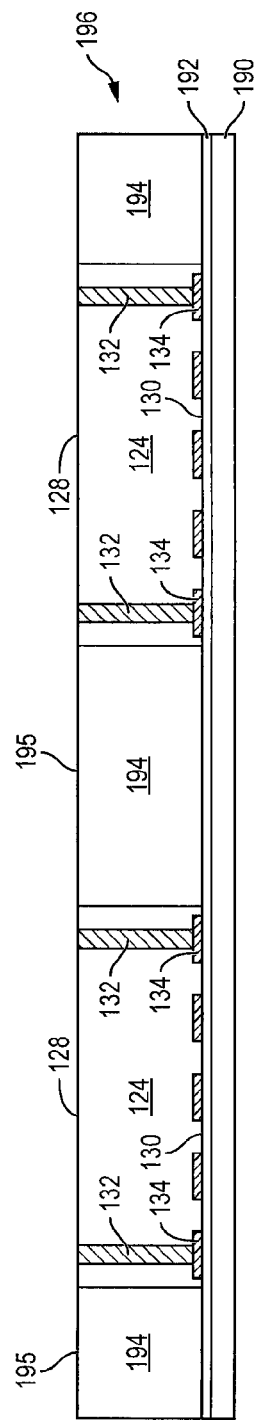
FIG. 7a
FIG. 7b
FIG. 7c

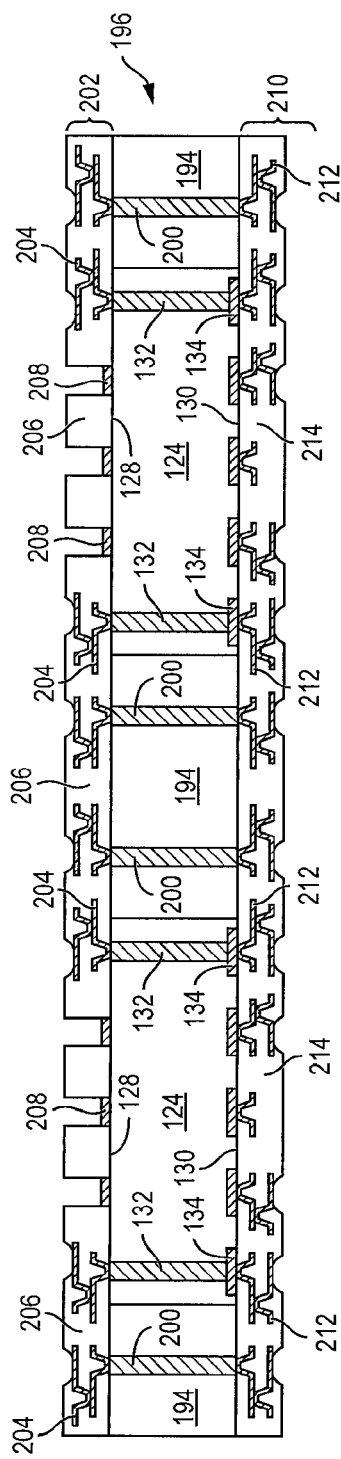
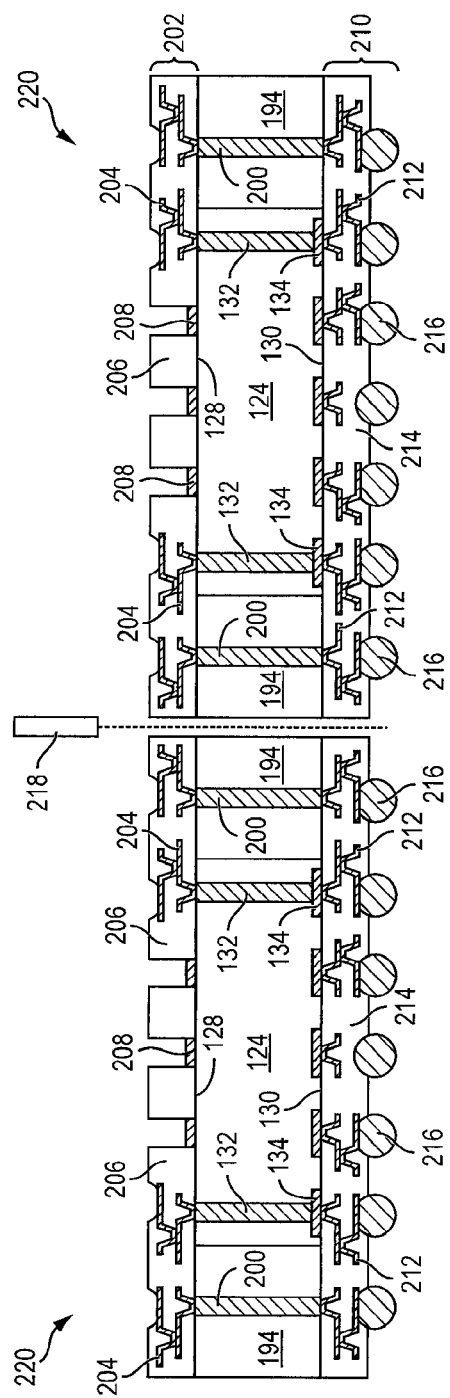

SEMICONDUCTOR DEVICE AND METHOD OF EMBEDDING TSV SEMICONDUCTOR DIE WITHIN ENCAPSULANT WITH TMV FOR VERTICAL INTERCONNECT IN POP

FIELD OF THE INVENTION

The present invention relates in general to semiconductor devices and, more particularly, to a semiconductor device and method of embedding a TSV semiconductor die within an encapsulant with a conductive TMV for vertical interconnect in a semiconductor PoP.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. The term "semiconductor die" as used herein refers to both the singular and plural form of the word, and accordingly can refer to both a single semiconductor device and multiple semiconductor devices. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

Semiconductor die are commonly stacked or otherwise require vertical z-direction interconnect capability. The vertical interconnect can be achieved with conductive through hole vias (THV) or conductive through silicon vias (TSV). The THVs and TSVs are formed by completely filling vias formed through encapsulant or base semiconductor material with electrically conductive material. The conductive vias are electrically connected to contact pads on the semiconductor die with redistribution layers (RDL). When stacking semiconductor die, the TSV or THV of the upper die is electrically connected to the TSV or THV of the lower die with bumps. The vertical interconnect provided by conductive TSV and THV typically has a large form factor and package size. The larger semiconductor package size has a lower unit density on a substrate or PCB, which increases manufacturing cost.

SUMMARY OF THE INVENTION

A need exists for a simple and cost effective vertical electrical interconnect for semiconductor PoP configurations. Accordingly, in one embodiment, the present invention is a method of making a semiconductor device comprising the steps of providing a first conductive layer, mounting a plurality of first semiconductor die having a conductive TSV over the first conductive layer, depositing an encapsulant around the first semiconductor die and over the first conductive layer to embed the first semiconductor die, forming a conductive TMV through the encapsulant, forming a second conductive layer over a first surface of the encapsulant, forming a first insulating layer over the first surface of the encapsulant while exposing portions of the second conductive layer, and forming a second insulating layer over the second surface of the encapsulant while exposing portions of the first conductive layer.

In another embodiment, the present invention is a method of making a semiconductor device comprising the steps of providing a carrier, mounting a plurality of first semiconductor die having a first conductive via to the carrier, depositing an encapsulant around the first semiconductor die and over the carrier, forming a second conductive via through the encapsulant, forming a first interconnect structure over a first surface of the encapsulant, removing the carrier, forming a second interconnect structure over a second surface of the encapsulant opposite the first surface of the encapsulant, and forming a first conductive layer over a back surface of the first semiconductor die.

In another embodiment, the present invention is a method of making a semiconductor device comprising the steps of providing a first semiconductor die having a first conductive via, depositing an encapsulant around the first semiconductor die, forming a second conductive via through the encapsulant, forming a first interconnect structure over a first surface of the encapsulant, and forming a second interconnect structure over a second surface of the encapsulant.

In another embodiment, the present invention is a semiconductor device comprising a first semiconductor die having a first conductive via. An encapsulant is deposited around the first semiconductor die. A second conductive via is formed through the encapsulant. A first interconnect structure is formed over a first surface of the encapsulant. A second interconnect structure is formed over a second surface of the encapsulant.

BRIEF DESCRIPTION OF THE DRAWINGS

FIGS. 7a-7h illustrate another process of embedding a TSV semiconductor die within an encapsulant with a conductive TMV for vertical interconnect in a semiconductor PoP;

DETAILED DESCRIPTION OF THE DRAWINGS

Figure 1:
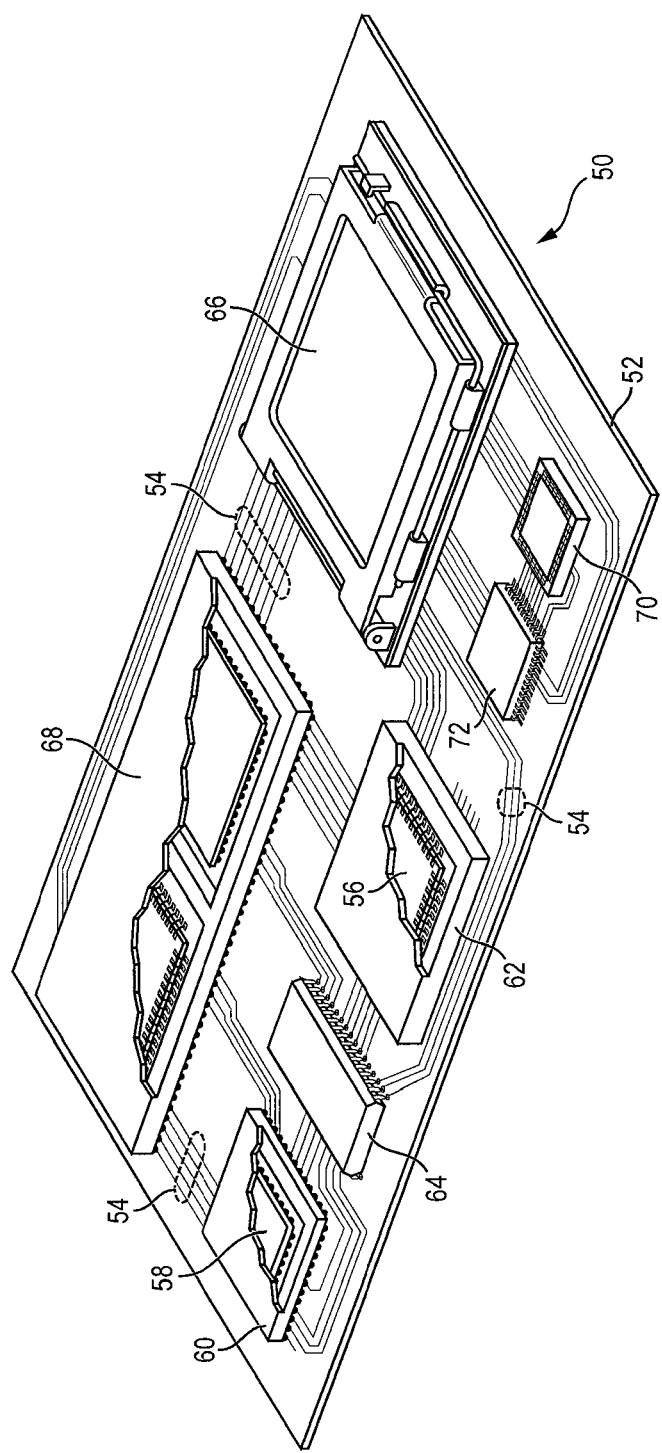
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along nonfunctional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
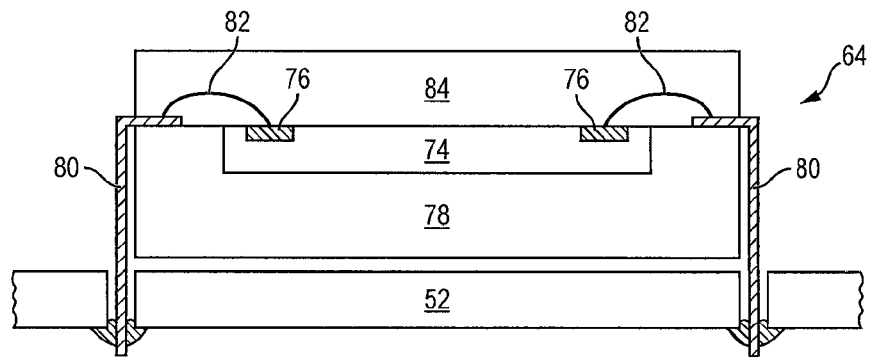
FIGS. 2a-2c illustrate further detail of the representative semiconductor packages mounted to the PCB.
Figure 2B:
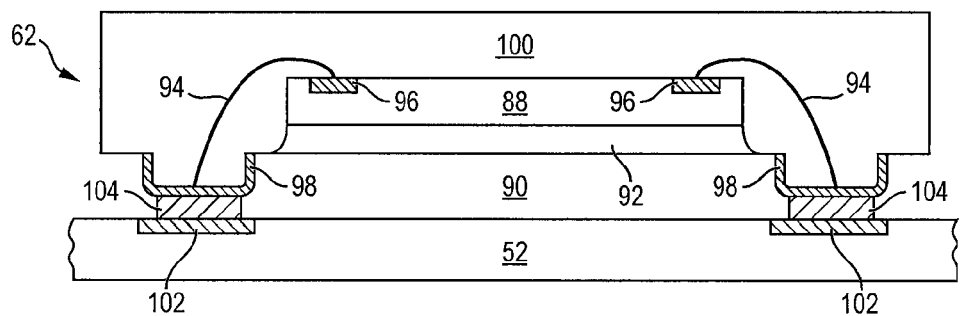
Figure 2C:
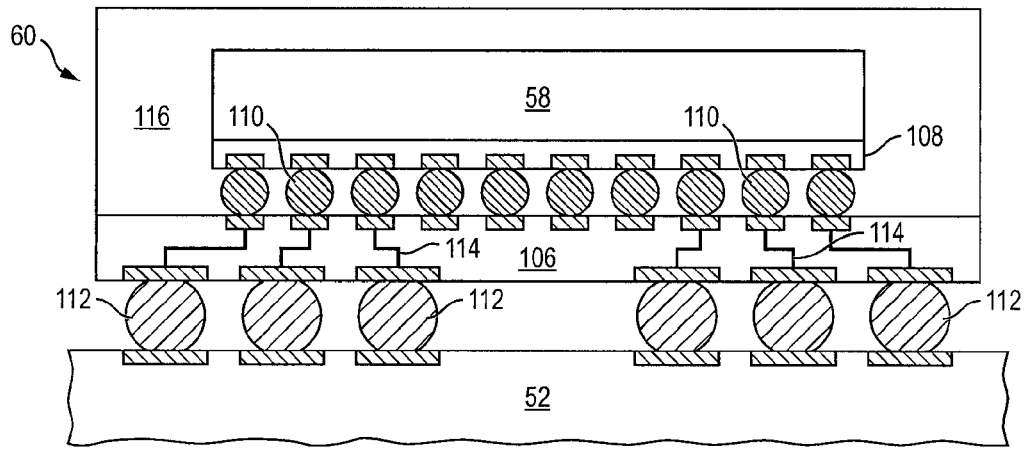

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
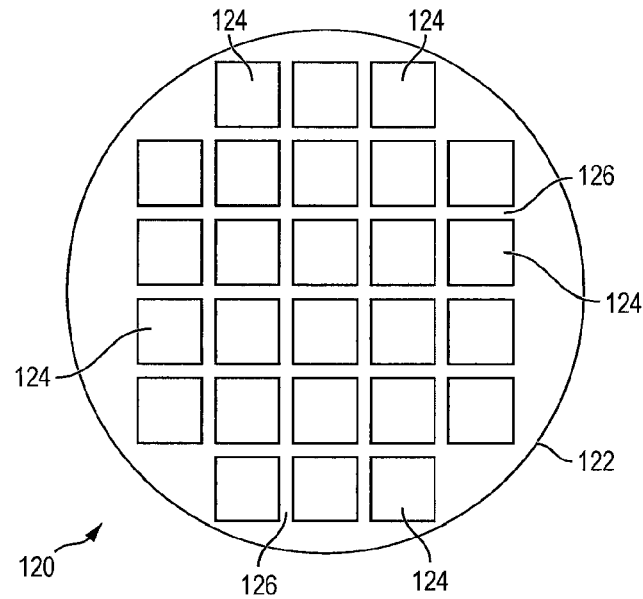
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor die 124 may have dimensions ranging from 2×2 millimeters (mm) to 15×15 mm.

Figure 3B:
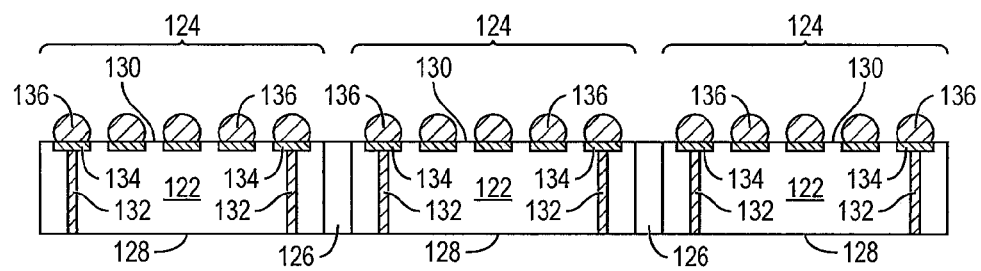

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type die.

A plurality of vias is formed into active surface 130 and through semiconductor wafer 120 using mechanical drilling, laser drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction conductive TSV 132 embedded within semiconductor die 124.

An electrically conductive layer 134 is formed over active surface 130 using PVD, CVD, electrolytic plating, electroless plating process, or other suitable metal deposition process. Conductive layer 134 can be one or more layers of Al, Cu, Sn, Ni, Au, Ag, or other suitable electrically conductive material. Conductive layer 134 operates as contact pads electrically connected to the circuits on active surface 130. Contact pads 134 can be disposed side-by-side a first distance from the edge of semiconductor die 124, as shown in FIG. 3b. Alternatively, contact pads 134 can be offset in multiple rows such that a first row of contact pads is disposed a first distance from the edge of the die, and a second row of contact pads alternating with the first row is disposed a second distance from the edge of the die.

An electrically conductive bump material is deposited over contact pads 134 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 134 using a suitable attachment or bonding process. In one embodiment, the bump material is reflowed by heating the material above its melting point to form spherical balls or bumps 136. In some applications, bumps 136 are reflowed a second time to improve electrical contact to contact pads 134. Bumps 136 can also be compression bonded to contact pads 134. Bumps 136 represent one type of interconnect structure that can be formed over contact pads 134. The interconnect structure can also use stud bump, micro bump, or other electrical interconnect.

Figure 3C:
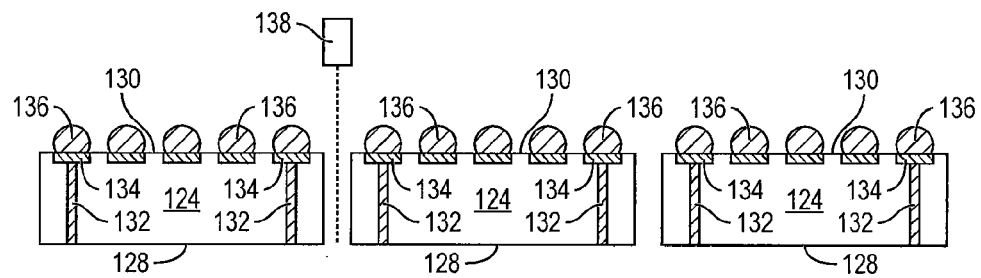

In FIG. 3c, semiconductor wafer 120 is singulated through saw street 126 using a saw blade or laser cutting tool 138 into individual TSV semiconductor die 124.

Figure 4H:
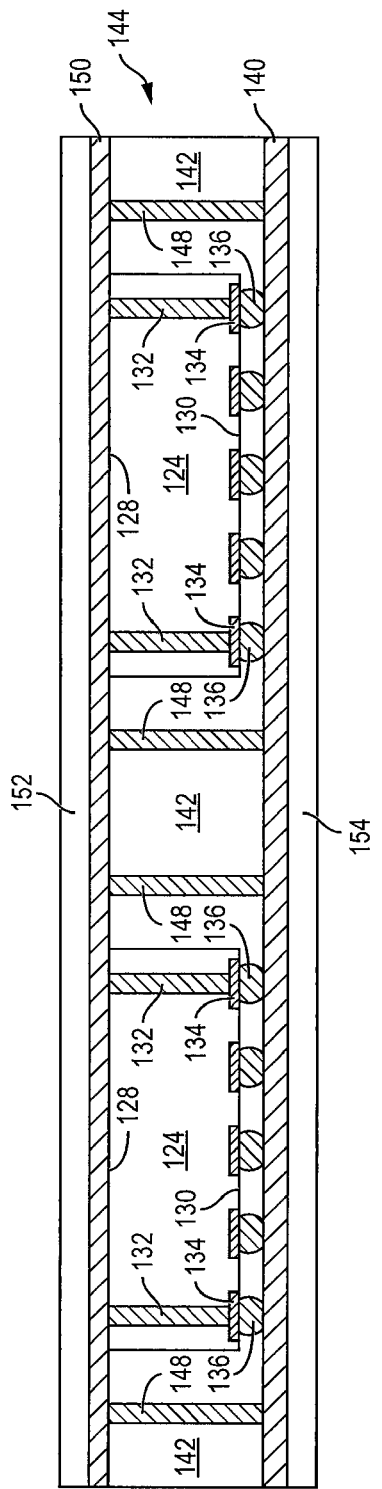
FIGS. 4a-4n illustrate a process of embedding a TSV semiconductor die within an encapsulant with a conductive TMV for vertical interconnect in a semiconductor PoP.
Figure 4I:
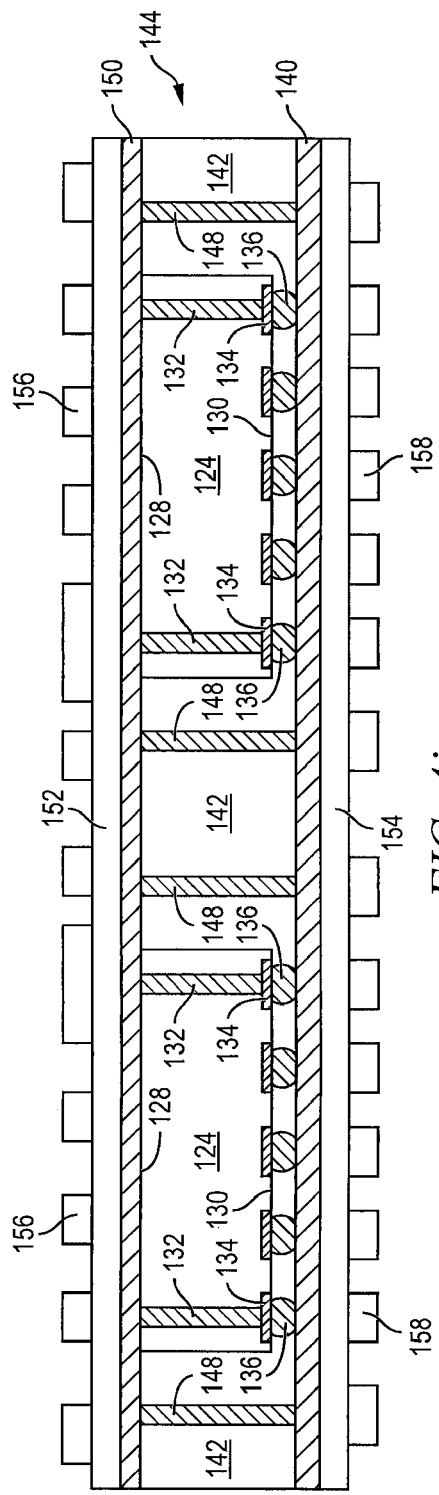
Figure 4L:
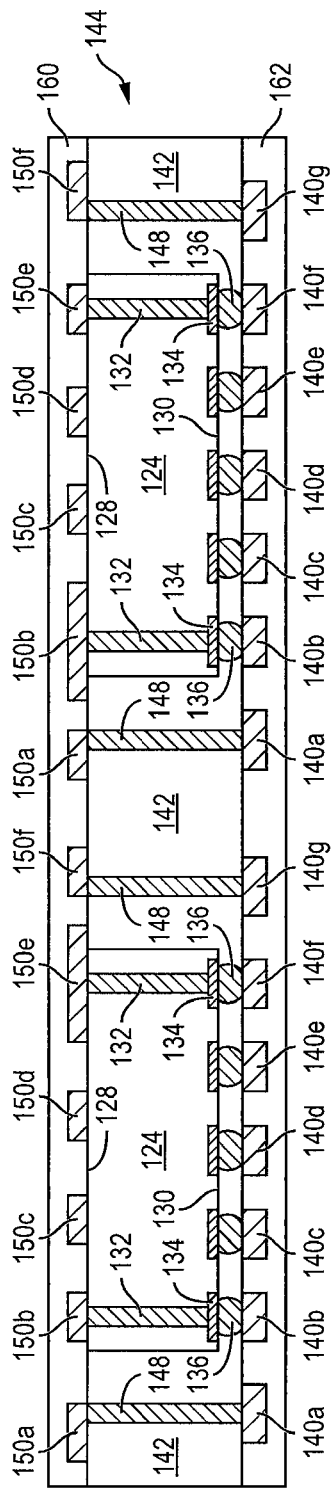
Figure 4M:
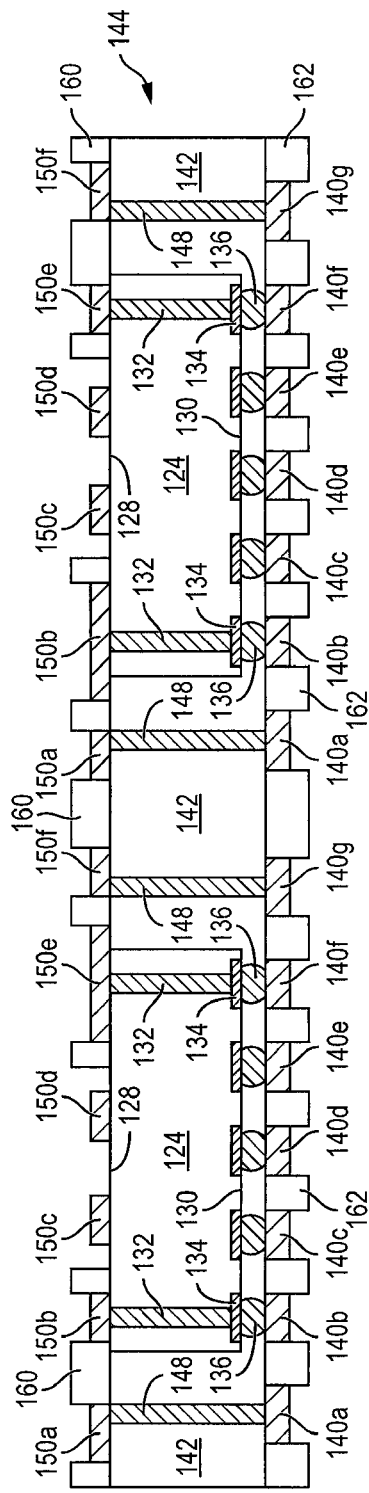
Figure 4N:
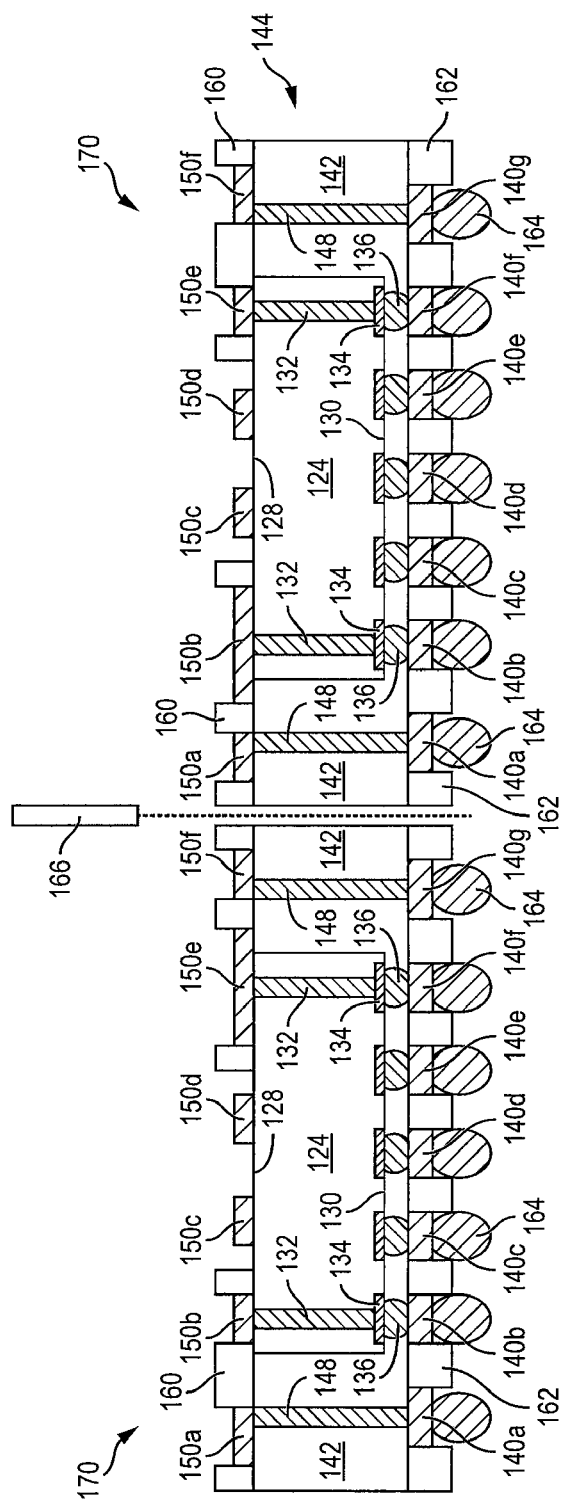

FIGS. 4a-4n illustrate, in relation to FIGS. 1 and 2a-2c, a process of embedding a TSV semiconductor die within an encapsulant with a conductive TMV for vertical interconnect in a semiconductor PoP. FIG. 4a shows a base electrically conductive layer 140 containing one or more layers of Al, Cu, Sn, Ni, Au, Ag, or other suitable electrically conductive material.

The TSV semiconductor die 124 from FIGS. 3a-3c are mounted to conductive layer 140 using a pick and place operation with active surface 130 oriented toward the conductive layer. FIG. 4b shows TSV semiconductor die 124 mounted to conductive layer 140.

In FIG. 4c, an encapsulant or molding compound 142 is deposited around semiconductor die 124 and over conductive layer 140 using a paste printing, compressive molding, transfer molding, liquid encapsulant molding, vacuum lamination, spin coating, or other suitable applicator. Encapsulant 142 can be polymer composite material, such as epoxy resin with filler, epoxy acrylate with filler, or polymer with proper filler. Encapsulant 142 is non-conductive and environmentally protects the semiconductor device from external elements and contaminants. The top surface 143 of encapsulant 142 is made substantially coplanar with back surface 128 of semiconductor die 124 by controlling the deposition of the encapsulant material or by backgrinding the encapsulant to be even with the back surface of the die. Encapsulant 142 embeds semiconductor die 124 within substrate 144 constituting the encapsulant and conductive layer 140.

In FIG. 4d, a plurality of vias 146 is formed through encapsulant 142 around a perimeter of semiconductor die 124 using mechanical drilling, laser drilling, or DRIE. The vias 146 extend down to conductive layer 140. The vias 146 are filled with Al, Cu, Sn, Ni, Au, Ag, Ti, W, poly-silicon, or other suitable electrically conductive material using electrolytic plating, electroless plating process, or other suitable metal deposition process to form z-direction conductive TMV 148 embedded within encapsulant 142, as shown in FIG. 4e. The conductive TMV 148 are electrically connected to conductive layer 140. FIG. 4f shows a top view of conductive TSVs 132 formed within semiconductor die 124 and conductive TMVs 148 formed around the semiconductor die.

In FIG. 4g, an electrically conductive layer 150 is formed over a surface of encapsulant 142 opposite conductive layer 140 using PVD, CVD, electrolytic plating, electroless plating process, or other suitable metal deposition process. Conductive layer 150 can be one or more layers of Al, Cu, Sn, Ni, Au, Ag, or other suitable electrically conductive material. The conductive TMV 148 are electrically connected to conductive layer 150.

In FIG. 4h, an insulating layer 152 is formed over conductive layer 150. Likewise, an insulating layer 154 is formed over conductive layer 140. In one embodiment, insulating layers 152 and 154 can be a photo-sensitive dry film layer suitable for patterning and developing, such as photo resist or polymer material.

In FIG. 4i, a photo-mask layer 156 is formed over insulating layer 152 and conductive layer 150 for patterning and developing the insulating layer in order to remove a portion of the conductive layer, as shown in FIG. 4j. Likewise, a photo-mask layer 158 is formed over insulating layer 154 and conductive layer 140 for patterning and developing the insulating layer in order to remove a portion of the conductive layer. Photo-mask layer 156 and insulating layer 152 are removed in FIG. 4k to leave conductive layer 150 etched with the desired pattern containing a plurality of conductive segments 150a-150f disposed over encapsulant 142 and back surface 128 for electrical connection to conductive TSV 132 and conductive TMV 148. Conductive segments 150c-150d can be arranged in a ball grid array (BGA) electrical interconnect pattern on back surface 128 of semiconductor die 124. Photo-mask layer 158 and insulating layer 154 are removed to leave conductive layer 140 etched with the desired pattern containing a plurality of conductive segments 140a-140g disposed over encapsulant 142 and semiconductor die 124 for electrical connection to the die through bumps 136, as well as electrical connection to conductive TSV 132 and conductive TMV 148. The post-etched conductive segments 140a-140g and 150a-150f are electrically common or electrically isolated depending on the design and function of semiconductor die 124.

In FIG. 4l, an insulating or passivation layer 160 is formed over conductive layer 150 and encapsulant 142 using PVD, CVD, printing, spin coating, spray coating, sintering or thermal oxidation. An insulating or passivation layer 162 is formed over conductive layer 140 and encapsulant 142 using PVD, CVD, printing, spin coating, spray coating, sintering or thermal oxidation. The insulating layers 160 and 162 contain one or more layers of solder resist, silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 160 is removed by an etching process to expose conductive segments 150a-150f, as shown in FIG. 4m. A portion of insulating layer 156 is removed by an etching process to expose conductive segments 140a-140g.

In FIG. 4n, an electrically conductive bump material is deposited over conductive segments 140a-140g using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive segments 140a-140g using a suitable attachment or bonding process. In one embodiment, the bump material is reflowed by heating the material above its melting point to form spherical balls or bumps 164. In some applications, bumps 164 are reflowed a second time to improve electrical contact to conductive segments 140a-140g. Bumps 164 can also be compression bonded to conductive segments 140a-140g. Bumps 164 represent one type of interconnect structure that can be formed over conductive segments 140a-140g. The interconnect structure can also use stud bump, micro bump, or other electrical interconnect.

The semiconductor device is singulated through insulating layers 160 and 162 and encapsulant 142 between semiconductor die 124 using a saw blade or laser cutting tool 166 to separate individual semiconductor packages 170.

Figure 5:
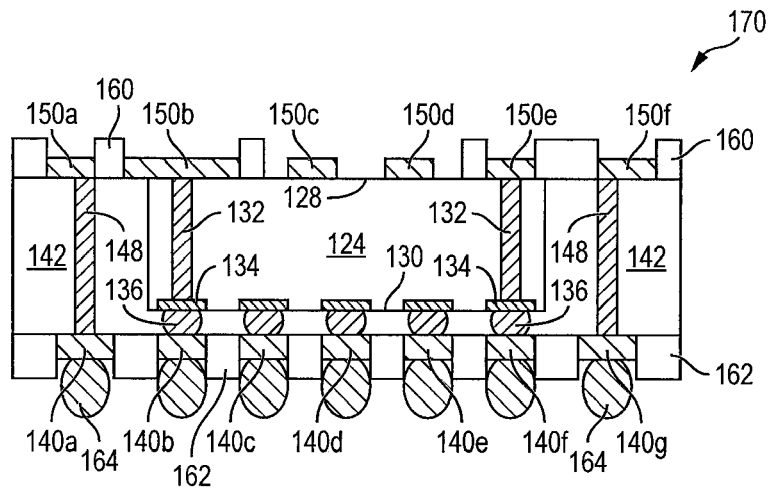
FIG. 5 illustrates the TSV semiconductor die within the encapsulant with conductive TMV for vertical interconnect in the semiconductor PoP.

FIG. 5 shows semiconductor package 170 after singulation. The TSV semiconductor die 124 is embedded within encapsulant 142 and electrically connected through bumps 136 and conductive segments 140a-140g to bumps 164 for external interconnect from a bottom side of semiconductor package 170. Semiconductor die 124 is also electrically connected through conductive TSV 132 within the die and conductive TMV 148 within encapsulant 142 and conductive segments 140a-140g and 150a-150f for external interconnect from a topside of semiconductor package 170. The vertical interconnect provided by conductive TSV 132, conductive TMV 148, and conductive segments 140a-140g and 150a-150f achieves a smaller form factor to reduce the package footprint. The smaller size of semiconductor package 170 gives a high unit density on a substrate or PCB, which reduces manufacturing cost.

Figure 6:
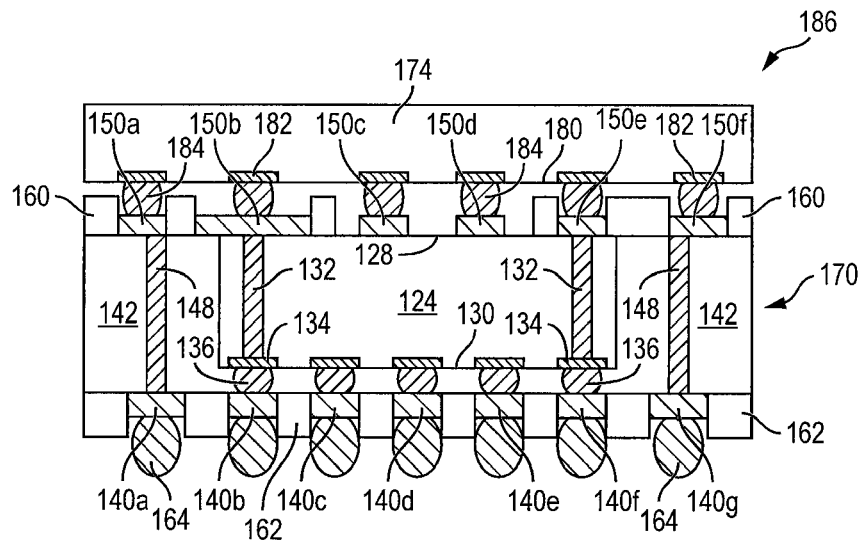
FIG. 6 illustrates a semiconductor die mounted to the embedded TSV semiconductor package.

FIG. 6 shows a semiconductor die 174 with an active surface 180 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 180 to implement analog circuits or digital circuits, such as DSP, ASIC, memory, or other signal processing circuit. Semiconductor die 174 may also contain IPDs, such as inductors, capacitors, and resistors, for RF signal processing. In one embodiment, semiconductor die 174 is a flipchip type die.

An electrically conductive layer 182 is formed over active surface 180 using PVD, CVD, electrolytic plating, electroless plating process, or other suitable metal deposition process. Conductive layer 182 can be one or more layers of Al, Cu, Sn, Ni, Au, Ag, or other suitable electrically conductive material. Conductive layer 182 operates as contact pads electrically connected to the circuits on active surface 180. Contact pads 182 can be disposed side-by-side a first distance from the edge of semiconductor die 174. Alternatively, contact pads 182 can be offset in multiple rows such that a first row of contact pads is disposed a first distance from the edge of the die, and a second row of contact pads alternating with the first row is disposed a second distance from the edge of the die.

A plurality of bumps 184 is formed over contact pads 182. Semiconductor die 174 is mounted to semiconductor package 170 with bumps 184 bonded to conductive segments 150a-150f in a package-on-package (PoP) configuration 186. In one embodiment, semiconductor die 174 is a memory die and semiconductor die 124 is a baseband signal processing die. Semiconductor die 174 is electrically connected through bumps 184, conductive TSV 132, conductive TMV 148, and conductive segments 140a-140g and 150a-150f to semiconductor die 124. Semiconductor die 174 is also electrically connected to bumps 164 for external interconnect. Conductive TSV 132 provides a vertical fan-in electrical interconnect to conductive segments 150b and 150e. Conductive TMV 148 provides a vertical fan-out electrical interconnect between conductive segments 150a and 150f and conductive segments 140a and 140g. The combined vertical fan-in interconnect and vertical fan-out interconnect offers design flexibility for multi-functional PoP. Semiconductor PoP 186 exhibits reduced susceptibility to warpage and high surface mount technology (SMT) yield with a small form factor. Semiconductor PoP 186 uses a simplified assembly process for higher productivity in terms of manufacturing units per hour (UPH) at lower production cost for the semiconductor PoP.

Figure 7D:
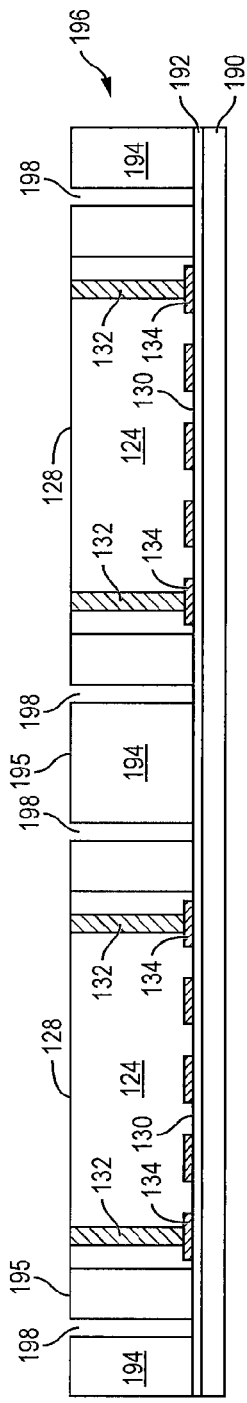

FIGS. 7a-7h illustrate, in relation to FIGS. 1 and 2a-2c, another process of embedding a TSV semiconductor die within an encapsulant with a conductive TMV for vertical interconnect in a semiconductor PoP. FIG. 7a shows a substrate or carrier 190 containing temporary or sacrificial base material such as silicon, polymer, beryllium oxide, or other suitable low-cost, rigid material for structural support. An interface layer or double-sided tape 192 is formed over carrier 190 as a temporary adhesive bonding film or etch-stop layer. The TSV semiconductor die 124, similar to FIGS. 3a-3c but without bumps 136, are mounted to carrier 190 and interface layer 192 using a pick and place operation with active surface 130 oriented toward the carrier. FIG. 7b shows TSV semiconductor die 124 mounted to carrier 190.

In FIG. 7c, an encapsulant or molding compound 194 is deposited around semiconductor die 124 and over carrier 190 using a paste printing, compressive molding, transfer molding, liquid encapsulant molding, vacuum lamination, spin coating, or other suitable applicator. Encapsulant 194 can be polymer composite material, such as epoxy resin with filler, epoxy acrylate with filler, or polymer with proper filler. The top surface 195 of encapsulant 194 is made substantially coplanar with back surface 128 of semiconductor die 124 by controlling the deposition of the encapsulant material or by backgrinding the encapsulant to be even with the back surface of the die. Encapsulant 194 is non-conductive and environmentally protects the semiconductor device from external elements and contaminants. Encapsulant 194 embeds semiconductor die 124 within substrate 196.

Figure 7E:
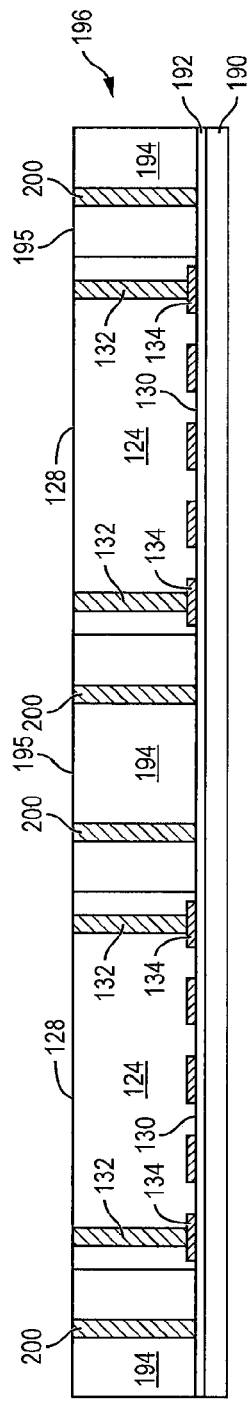

In FIG. 7d, a plurality of vias 198 is formed into encapsulant 194 around a perimeter of semiconductor die 124 using mechanical drilling, laser drilling, or DRIE. The vias 198 extend down to interface layer 192. The vias 198 are filled with Al, Cu, Sn, Ni, Au, Ag, Ti, W, poly-silicon, or other suitable electrically conductive material using electrolytic plating, electroless plating process, or other suitable metal deposition process to form z-direction conductive through mold vias (TMV) 200 embedded within encapsulant 194, as shown in FIG. 7e.

Figure 7F:
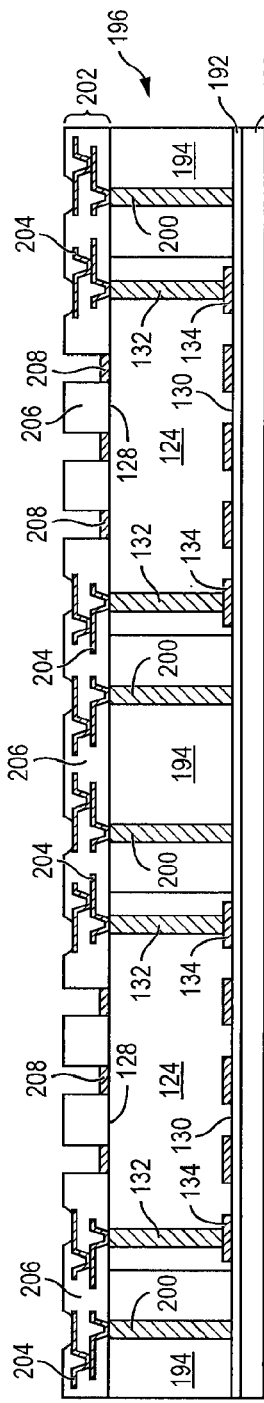

In FIG. 7f, a build-up interconnect structure 202 is formed over encapsulant 194, conductive TSV 132, and conductive TMVs 200. The build-up interconnect structure 202 includes an electrically conductive layer or RDL 204 formed using a patterning and metal deposition process such as sputtering, electrolytic plating, and electroless plating. Conductive layer 204 can be one or more layers of Al, Cu, Sn, Ni, Au, Ag, or other suitable electrically conductive material. One portion of conductive layer 204 is electrically connected to conductive TSVs 132 of semiconductor die 124. Another portion of conductive layer 204 is electrically connected to conductive TMVs 200. Other portions of conductive layer 204 can be electrically common or electrically isolated depending on the design and function of semiconductor die 124.

An insulating or passivation layer 206 is formed between conductive layer 204 for electrical isolation using PVD, CVD, printing, spin coating, spray coating, sintering or thermal oxidation. The insulating layer 206 contains one or more layers of SiO2, Si3N4, SiON, Ta2O5, Al2O3, or other material having similar insulating and structural properties. A portion of insulating layer 206 can be removed by an etching process to expose conductive layer 204 and back surface 128 of semiconductor die 124 for additional electrical interconnect.

An electrically conductive layer 208 is formed in the removed portion of insulating layer 206 over back surface 128 of semiconductor die 124 using PVD, CVD, electrolytic plating, electroless plating process, or other suitable metal deposition process. Conductive layer 208 can be one or more layers of Al, Cu, Sn, Ni, Au, Ag, or other suitable electrically conductive material. Conductive layer 208 can be arranged in a BGA electrical interconnect pattern on back surface 128 of semiconductor die 124. Conductive layer 208 is electrically connected to conductive layer 204.

In FIG. 7g, carrier 190 and interface layer 192 are removed by chemical etching, mechanical peeling, CMP, mechanical grinding, thermal bake, UV light, laser scanning, or wet stripping to expose active surface 130, encapsulant 194, conductive TSV 132, and conductive TMVs 200. A build-up interconnect structure 210 is formed over encapsulant 194, semiconductor die 124, conductive TSV 132, and conductive TMVs 200. The build-up interconnect structure 210 includes an electrically conductive layer or RDL 212 formed using a patterning and metal deposition process such as sputtering, electrolytic plating, and electroless plating. Conductive layer 212 can be one or more layers of Al, Cu, Sn, Ni, Au, Ag, or other suitable electrically conductive material. One portion of conductive layer 212 is electrically connected to conductive TSVs 132 of semiconductor die 124. Another portion of conductive layer 212 is electrically connected to conductive TMVs 200. Another portion of conductive layer 212 is electrically connected to contact pads 134 of semiconductor die 124. Other portions of conductive layer 212 can be electrically common or electrically isolated depending on the design and function of semiconductor die 124.

An insulating or passivation layer 214 is formed between conductive layer 212 for electrical isolation using PVD, CVD, printing, spin coating, spray coating, sintering or thermal oxidation. The insulating layer 214 contains one or more layers of SiO2, Si3N4, SiON, Ta2O5, Al2O3, or other material having similar insulating and structural properties. A portion of insulating layer 214 can be removed by an etching process to expose conductive layer 212.

In FIG. 7h, an electrically conductive bump material is deposited over build-up interconnect structure 210 and electrically connected to the exposed portion of conductive layer 212 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 212 using a suitable attachment or bonding process. In one embodiment, the bump material is reflowed by heating the material above its melting point to form spherical balls or bumps 216. In some applications, bumps 216 are reflowed a second time to improve electrical contact to conductive layer 212. Bumps 216 can also be compression bonded to conductive layer 212. Bumps 216 represent one type of interconnect structure that can be formed over conductive layer 212. The interconnect structure can also use stud bump, micro bump, or other electrical interconnect.

Figure 8A:
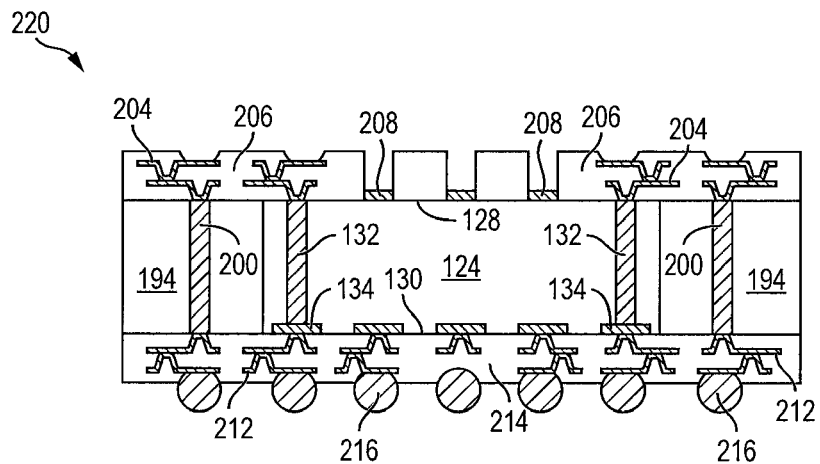
FIGS. 8a-8b illustrate the TSV semiconductor die within the encapsulant with conductive TMV and a conductive layer over the back surface of the TSV die.
Figure 8B:
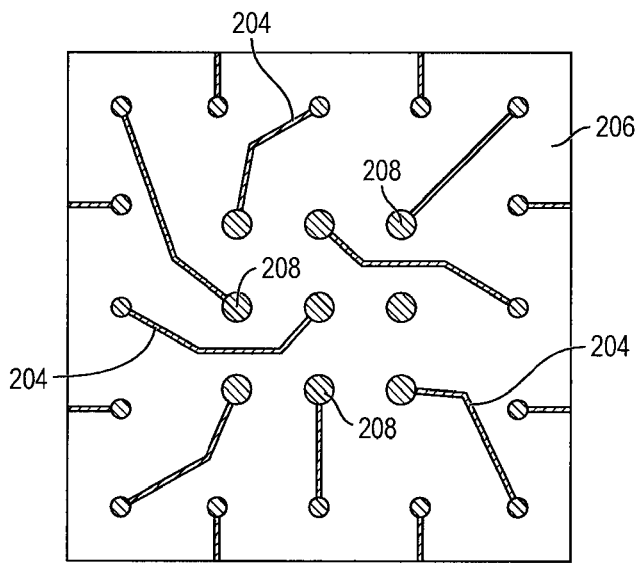

Semiconductor die 124 are singulated through encapsulant 194 with saw blade or laser cutting tool 218 into individual semiconductor packages 220, as shown in FIG. 8a. The TSV semiconductor die 124 is embedded within encapsulant 194 and electrically connected through build-up interconnect structure 210 for external interconnect from a bottom side of semiconductor package 220. Semiconductor die 124 is also electrically connected through conductive TSV 132 within the die and conductive TMV 200 within encapsulant 194 and build-up interconnect structures 202 and 210 for external interconnect from a topside of semiconductor package 220. The vertical interconnect provided by conductive TSV 132, conductive TMV 200, and build-up interconnect structures 202 and 210 achieves a smaller form factor to reduce the package footprint. FIG. 8b shows a top view of the BGA pattern of conductive layer 208. The smaller size of semiconductor package 220 gives a high unit density on a substrate or PCB, which reduces manufacturing cost.

Figure 9A:
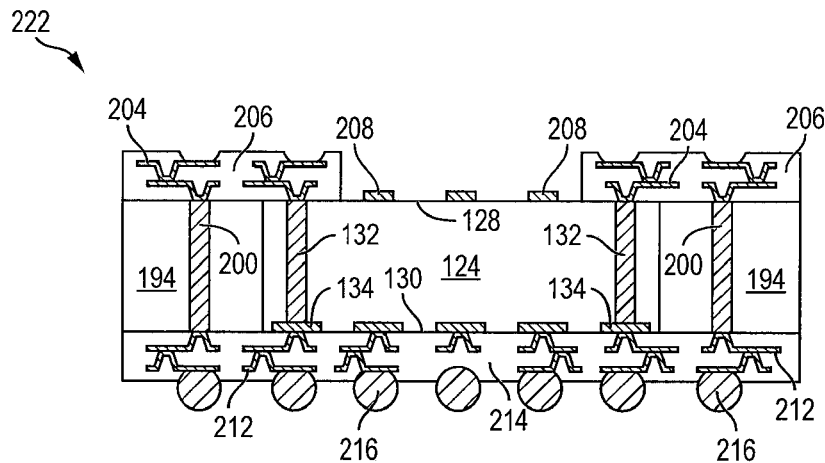
FIGS. 9a-9b illustrate the TSV semiconductor die within the encapsulant with a conductive TMV and an exposed back surface of the TSV die.
Figure 9B:
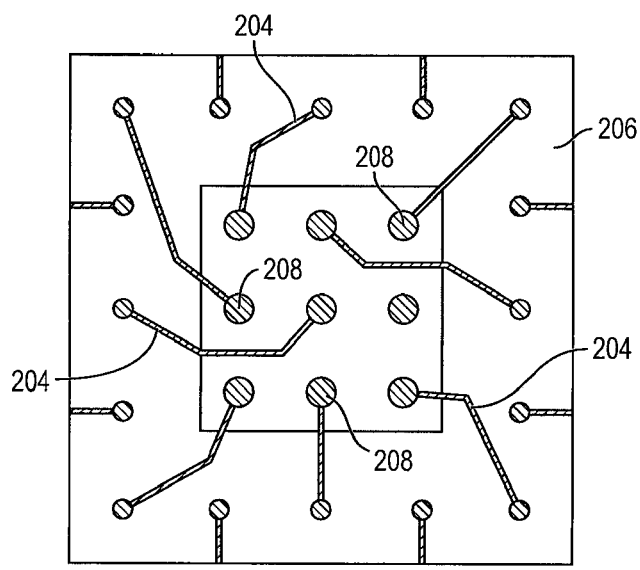

FIG. 9a-9b show a cross-sectional view and top view of another embodiment of semiconductor package 222, similar to FIGS. 8a-8b, with additional portions of insulating layer 206 removed to expose a majority of back surface 128 of semiconductor die 124 for enhanced heat dissipation of semiconductor die 124. Similar to FIG. 7f, conductive layer 208 can be arranged in a BGA electrical interconnect pattern on back surface 128 of semiconductor die 124.

Figure 10:
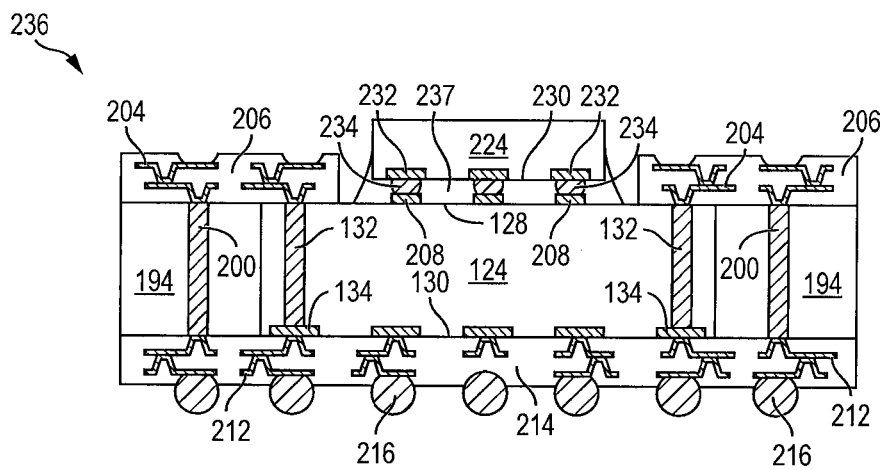
FIG. 10 illustrates a semiconductor die mounted to a back surface of the embedded TSV semiconductor die.

FIG. 10 shows a semiconductor die 224 having an active surface 230 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 230 to implement analog circuits or digital circuits, such as DSP, ASIC, memory, or other signal processing circuit. Semiconductor die 224 may also contain IPDs, such as inductors, capacitors, and resistors, for RF signal processing. In one embodiment, semiconductor die 224 is a flipchip type die.

An electrically conductive layer 232 is formed over active surface 230 using PVD, CVD, electrolytic plating, electroless plating process, or other suitable metal deposition process. Conductive layer 232 can be one or more layers of Al, Cu, Sn, Ni, Au, Ag, or other suitable electrically conductive material. Conductive layer 232 operates as contact pads electrically connected to the circuits on active surface 230. Contact pads 232 can be disposed side-by-side a first distance from the edge of semiconductor die 224. Alternatively, contact pads 232 can be offset in multiple rows such that a first row of contact pads is disposed a first distance from the edge of the die, and a second row of contact pads alternating with the first row is disposed a second distance from the edge of the die.

A plurality of bumps 234 is formed over contact pads 232. Semiconductor die 224 is mounted to semiconductor package 222 with bumps 234 bonded to conductive layer 208 in a PoP configuration 236. An underfill material 237, such as epoxy resin, is deposited between semiconductor die 224 and back surface 128 of semiconductor die 124. In one embodiment, semiconductor die 224 is a memory die and semiconductor die 124 is a baseband signal processing die. Semiconductor die 224 is electrically connected through bumps 234, conductive TSV 132, conductive TMV 148, conductive layers 208, and build-up interconnect structures 202 and 210 to semiconductor die 124. Semiconductor die 224 is also electrically connected to bumps 216 for external interconnect. Conductive TSV 132 provides a vertical fan-in electrical interconnect to build-up interconnect structures 202 and 210. Conductive TMV 148 provides a vertical fan-out electrical interconnect to build-up interconnect structures 202 and 210. The combined vertical fan-in interconnect and vertical fan-out electrical interconnect offers design flexibility for multi-functional PoP. The exposed back surface 128 provides enhanced heat dissipation for semiconductor die 124. Semiconductor PoP 236 exhibits reduced susceptibility to warpage and high SMT yield with a small form factor. Semiconductor PoP 236 uses a simplified assembly process for higher productivity in terms of manufacturing UPH at lower production cost for the semiconductor PoP.

Figure 11:
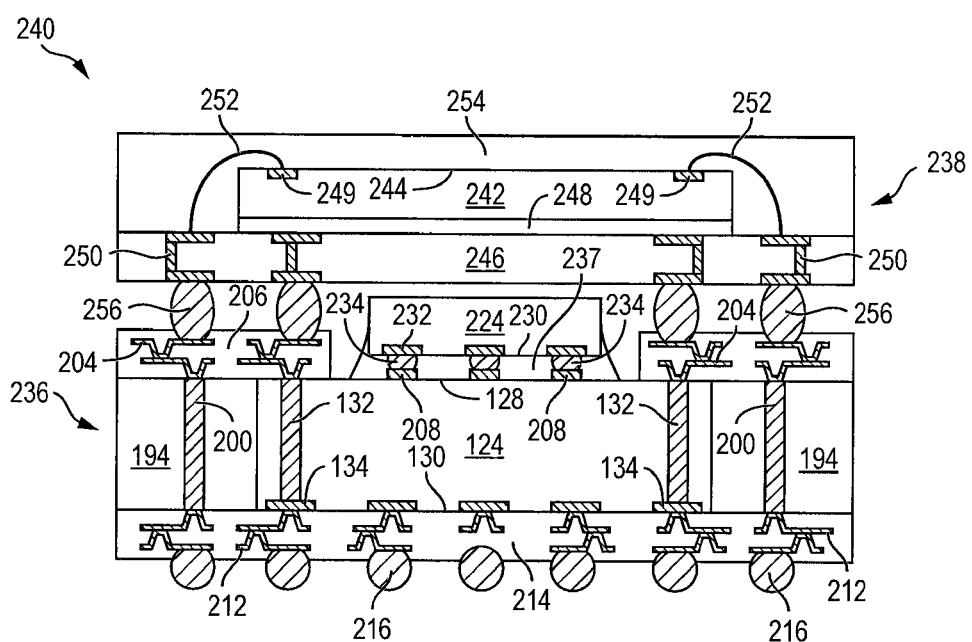
FIG. 11 illustrates a semiconductor package mounted to the embedded TSV semiconductor package.

FIG. 11 shows an embodiment of semiconductor PoP 240, continuing from FIG. 10, with semiconductor die 242 having an active surface 244 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 244 to implement analog circuits or digital circuits, such as DSP, ASIC, memory, or other signal processing circuit. Semiconductor die 242 may also contain IPDs, such as inductors, capacitors, and resistors, for RF signal processing. Semiconductor die 242 is mounted to substrate 246 with die attach adhesive 248. The contact pads 249 of semiconductor die 242 are electrically connected to conductive traces 250 formed on substrate 246 with bond wires 252.

An encapsulant or molding compound 254 is deposited over semiconductor die 242 and substrate 246 using a paste printing, compressive molding, transfer molding, liquid encapsulant molding, vacuum lamination, spin coating, or other suitable applicator. Encapsulant 254 can be polymer composite material, such as epoxy resin with filler, epoxy acrylate with filler, or polymer with proper filler. Encapsulant 254 is non-conductive and environmentally protects the semiconductor device from external elements and contaminants.

Semiconductor package 258, with substrate 246 and semiconductor die 242 enclosed by encapsulant 254, is mounted to semiconductor package 236 with bumps 256 electrically connected to conductive layer 204 as semiconductor PoP 240. Semiconductor die 242 is electrically connected through bond wires 252, conductive traces 250, bumps 256, conductive TSV 132, conductive TMV 148, and build-up interconnect structures 202 and 210 to semiconductor die 124 and 224. Semiconductor die 242 is also electrically connected to bumps 164 for external interconnect. Conductive TSV 132 provides a vertical fan-in electrical interconnect to build-up interconnect structures 202 and 210. Conductive TMV 148 provides a vertical fan-out electrical interconnect to build-up interconnect structures 202 and 210. The combined vertical fan-in interconnect and vertical fan-out interconnect offers design flexibility for multi-functional PoP. Semiconductor PoP 186 exhibits reduced susceptibility to warpage and high SMT yield with a small form factor. Semiconductor PoP 240 uses a simplified assembly process for higher productivity in terms of manufacturing UPH at lower production cost for the semiconductor PoP.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first conductive layer;
   mounting a plurality of first semiconductor die having a conductive through silicon via (TSV) over the first conductive layer;
   depositing an encapsulant around the first semiconductor die and over the first conductive layer to embed the first semiconductor die;
   forming a conductive through mold via (TMV) through the encapsulant;
   forming a second conductive layer over a first surface of the encapsulant;
   forming a first insulating layer over the first surface of the encapsulant while exposing portions of the second conductive layer; and
   forming a second insulating layer over a second surface of the encapsulant while exposing portions of the first conductive layer.

2. The method of claim 1, further including forming a plurality of bumps over the first conductive layer.

3. The method of claim 1, further including singulating through the encapsulant to separate the first semiconductor die.

4. The method of claim 1, further including mounting a second semiconductor die over the first surface of the encapsulant electrically connected to the second conductive layer.

5. The method of claim 1, further including removing a portion of the first insulating layer to expose a back surface of the first semiconductor die.

6. A method of making a semiconductor device, comprising:
   providing a carrier;
   mounting a plurality of first semiconductor die having a first conductive via to the carrier;
   depositing an encapsulant around the first semiconductor die and over the carrier;
   forming a second conductive via through the encapsulant;

forming a first interconnect structure over a first surface of the encapsulant;
removing the carrier;
forming a second interconnect structure over a second surface of the encapsulant opposite the first surface of the encapsulant; and
forming a first conductive layer over a back surface of the first semiconductor die.

7. The method of claim 6, further including singulating through the encapsulant to separate the first semiconductor die.

8. The method of claim 6, wherein forming the first interconnect structure includes:
forming a second conductive layer over the first surface of the encapsulant; and
forming a first insulating layer over the second conductive layer.

9. The method of claim 6, further including mounting a second semiconductor die over the first surface of the encapsulant electrically connected to the first interconnect structure.

10. The method of claim 6, further including mounting a second semiconductor die over the back surface of the first semiconductor die electrically connected to the first conductive layer.

11. The method of claim 6, further including:
providing a substrate;
mounting a second semiconductor die to the substrate; and
mounting the substrate to the first interconnect structure.

12. The method of claim 6, wherein forming the second interconnect structure includes:
forming a second conductive layer over the second surface of the encapsulant; and
forming a first insulating layer over the second conductive layer.

13. The method of claim 12, wherein forming the second interconnect structure further includes forming a plurality of bumps over the second conductive layer.

14. A method of making a semiconductor device, comprising:
providing a first semiconductor die including an active surface and a non-active surface and including a plurality of first conductive vias;
depositing an encapsulant around the first semiconductor die and coplanar with the active surface and the non-active surface of the first semiconductor die;
forming a second conductive via through the encapsulant;
forming a first interconnect structure over a first surface of the encapsulant and over the non-active surface of the semiconductor die between the first conductive vias; and
forming a second interconnect structure over a second surface of the encapsulant.

15. The method of claim 14, wherein forming the first interconnect structure includes:
forming a first conductive layer over the first surface of the encapsulant; and
forming a first insulating layer over the first conductive layer.

16. The method of claim 14, wherein forming the second interconnect structure includes:
forming a first conductive layer over the second surface of the encapsulant; and
forming a first insulating layer over the first conductive layer.

17. The method of claim 14, further including disposing a second semiconductor die over the first surface of the encapsulant.

18. The method of claim 14, further including:
providing a substrate;
disposing a second semiconductor die over the substrate; and
disposing the substrate over the first interconnect structure.

19. The method of claim 14, further including forming a first conductive layer over the first semiconductor die.

20. The method of claim 19, further including disposing a second semiconductor die over the first semiconductor die.

21. A semiconductor device, comprising:
a first semiconductor die including a first conductive via;
an encapsulant deposited adjacent to the first semiconductor die;
a second conductive via formed through the encapsulant;
a first interconnect structure formed directly on a first surface of the encapsulant and a non-active surface of the first semiconductor die; and
a second interconnect structure formed on a second surface of the encapsulant.

22. The semiconductor device of claim 21, further including a second semiconductor die disposed over the first surface of the encapsulant.

23. The semiconductor device of claim 21, further including:
a substrate;
a second semiconductor die disposed over the substrate; and
the substrate disposed over the first interconnect structure.

24. The semiconductor device of claim 21, wherein the first interconnect structure further includes a first conductive layer formed in contact with the non-active surface of the first semiconductor die.

25. The semiconductor device of claim 24, further including a second semiconductor die disposed over the non-active surface of the first semiconductor die and electrically connected to the first conductive layer.

26. A method of making a semiconductor device, comprising:
providing a first semiconductor die including a first via;
depositing an encapsulant adjacent to the first semiconductor die;
forming a second via through the encapsulant;
forming a first conductive layer on a first surface of the encapsulant and contacting the first and second vias; and
forming a second conductive layer on a second surface of the encapsulant.

27. The method of claim 26, further including forming an insulating layer over the first surface of the encapsulant while exposing a portion of the first conductive layer.

28. The method of claim 26, further including disposing a second semiconductor die over the first surface of the encapsulant.

29. The method of claim 26, wherein depositing the encapsulant further includes the encapsulant being coplanar with a first surface and a second surface of the first semiconductor die.

30. A semiconductor device, comprising:
a first semiconductor die;
an encapsulant deposited adjacent to the first semiconductor die;
a first conductive via formed through the encapsulant; and
a conductive layer formed in contact with a non-active surface of the first semiconductor die.

31. The semiconductor device of claim 30, further including a second conductive via formed through the first semiconductor die.

32. The semiconductor device of claim 30, further including the conductive layer formed over the encapsulant and electrically connected to the first conductive via.

33. The semiconductor device of claim 30, further including an interconnect structure formed over an active surface of the first semiconductor die.

* * * * *